(12) United States Patent
Farrar

(10) Patent No.: US 7,105,841 B2
(45) Date of Patent: Sep. 12, 2006

(54) PHOTOLITHOGRAPHIC TECHNIQUES FOR PRODUCING ANGLED LINES

(75) Inventor: Paul A. Farrar, Okatie, SC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/928,771

(22) Filed: Aug. 27, 2004

(65) Prior Publication Data

US 2005/0030516 A1    Feb. 10, 2005

Related U.S. Application Data

(62) Division of application No. 10/215,214, filed on Aug. 8, 2002.

(51) Int. Cl.
*H01J 37/302* (2006.01)

(52) U.S. Cl. .............. 250/492.22; 700/57; 716/20; 716/21; 430/394

(58) Field of Classification Search ........... 250/310, 250/311, 492.22, 492.24, 492.2; 700/57; 716/20, 21; 430/394
See application file for complete search history.

(56) References Cited

U.S. PATENT DOCUMENTS

| | | | |
|---|---|---|---|
| 4,310,743 A * | 1/1982 | Seliger ............... 219/121.12 |
| 4,465,934 A | 8/1984 | Westerberg et al. |
| 4,748,478 A * | 5/1988 | Suwa et al. .............. 355/53 |
| 4,758,863 A * | 7/1988 | Nikkel ...................... 355/40 |
| 4,769,523 A * | 9/1988 | Tanimoto et al. ....... 219/121.6 |
| 5,251,140 A | 10/1993 | Chung et al. |
| 5,446,649 A | 8/1995 | Keum |
| 5,627,624 A | 5/1997 | Yim et al. |
| 5,671,173 A | 9/1997 | Tomita |
| 5,792,569 A | 8/1998 | Sun et al. |
| 5,821,592 A | 10/1998 | Hoenigschmid et al. |
| 6,178,131 B1 | 1/2001 | Ishikawa et al. |
| 6,215,128 B1 * | 4/2001 | Mankos et al. ........ 250/492.24 |
| 6,238,850 B1 | 5/2001 | Bula et al. |
| 6,282,113 B1 | 8/2001 | DeBrosse |
| 6,296,977 B1 | 10/2001 | Kaise et al. |
| 6,410,948 B1 | 6/2002 | Tran et al. ................ 257/202 |
| 6,426,269 B1 | 7/2002 | Haffner et al. |
| 6,448,591 B1 | 9/2002 | Juengling ................ 257/211 |
| 6,510,080 B1 | 1/2003 | Farrar ...................... 365/171 |

(Continued)

OTHER PUBLICATIONS

"X Architecture—Sleek, Fast . . . Not Your Father's Chip", *Semiconductor Magazine*, 2(8), (Aug. 2001), 3 pages.

(Continued)

*Primary Examiner*—Kiet T. Nguyen
(74) *Attorney, Agent, or Firm*—Schwegman, Lundberg, Woessner & Kluth, P.A.

(57) ABSTRACT

The present subject matter allows non-orthogonal lines to be formed at the same thickness as the orthogonal lines so as to promote compact designs, to be formed with even line edges, and to be formed efficiently. One aspect of the present subject matter relates to a method for forming non-orthogonal images in a raster-based photolithographic system. According to various embodiments of the method, a first image corresponding to a first data set is formed on a reticle when the reticle is at a first rotational position $\theta_1$. The reticle is adjusted to a second rotational position $\theta_2$. A second image corresponding to a second data set is formed on the reticle when the reticle is at the second rotational position $\theta_2$. The second image is non-orthogonal with respect to the first image. Other aspects are provided herein.

17 Claims, 12 Drawing Sheets

U.S. PATENT DOCUMENTS

| | | |
|---|---|---|
| 6,522,579 B1 | 2/2003 | Hoenigschmid |
| 6,581,198 B1 | 6/2003 | Teig et al. |
| 6,607,944 B1 | 8/2003 | Tran et al. .................. 438/129 |
| 6,645,842 B1 | 11/2003 | Igarashi et al. |
| 6,671,864 B1 | 12/2003 | Teig et al. |
| 6,678,872 B1 | 1/2004 | Teig et al. |
| 6,710,850 B1 * | 3/2004 | Yamaguchi et al. .......... 355/53 |
| 6,711,727 B1 | 3/2004 | Teig et al. |
| 6,745,379 B1 | 6/2004 | Teig et al. |
| 6,767,674 B1 | 7/2004 | Carpi |
| 6,769,105 B1 | 7/2004 | Teig et al. |
| 6,854,101 B1 | 2/2005 | Teig et al. |
| 6,892,371 B1 | 5/2005 | Teig et al. |
| 6,895,567 B1 | 5/2005 | Teig et al. |
| 6,898,773 B1 | 5/2005 | Teig et al. |
| 2004/0098696 A1 | 5/2004 | Teig et al. |
| 2004/0103387 A1 | 5/2004 | Teig et al. |
| 2004/0243960 A1 | 12/2004 | Hsu et al. |
| 2005/0026086 A1 | 2/2005 | Farrar |
| 2005/0030513 A1 | 2/2005 | Farrar |
| 2005/0048741 A1 | 3/2005 | Phan et al. |
| 2005/0091619 A1 | 4/2005 | Teig et al. |
| 2005/0280150 A1 | 12/2005 | Farrar |

OTHER PUBLICATIONS

EE Times Online, "RISC processor employs diagonal interconnects", *EE Times Online*, http://www.eetimes.com/showArticle.jhtml?articleID=10803033, (Feb. 6, 2002), 1 page.

EETimes Online, "Diagonal IC interconnects vs. right-angle grids will boost complex designs, says group", *EETimes Online*, (Jun. 4, 2001), 2 pages.

Fujimura, Aki , "Simplex—X Architecture Design Data", Presented at the Oct. 11, 2001 X Architecture Open Forum, (2001), 9 pages.

Fujimura, Aki , "X Architecture Benefits", X Architecture Open Forum at the Design Automation Conference in New Orleans, (Jun. 2002), 10 pages.

Gillette-Martin, Lisa , "Technology Innovations Reshape Industry", *The Inside Line*, 1(1), (Jul. 16, 2001), 1 page.

Hand, Aaron , "X Architecture Gets Lithographic Verification", *Semiconductor International*, (Jun. 1, 2002), 2 pages.

Igarashi, Mutsunori , et al., "A Diagonal-Interconnect Architecture and its Application to RISC Core Design", *ISSCC 2002/Session 12*, (2002), 4 pages.

Mitsuhashi, Takashi , et al., "Performance-Oriented Layout Design", *Design Wave Magazine*, (Sep. 2001), 59-64.

Montalti, Marco , "X Initiative", X Architecture Open Forum at the Design Automation Conference in New Orleans, (Jun. 2002), 4 pages.

Morrison, Gale , "X Marks the Spot", *Electronic News*, (Jun. 6, 2001), 2 pages.

Nickolas, Christina , "Chip architecture reduces interconnect length", *Electronic Products*, (Aug. 2001), 2 pages.

Rowen, Chris , "X and Processors", X Architecture Open Forum at the Design Automation Conference in New Orleans, (Jun. 11, 2002), 4 pages.

Rygler, Ken , "Motivation for X", X Architecture Open Forum at the Design Automation Conference in New Orleans, (Jun. 2002), 7 pages.

Song, Li , "Investigating a Lithography Strategy for Diagonal Routing Architecture at Sub-100nm Technology Nodes", *Data Analysis and Modeling for Process Control II*. Edited by Emami, Iraj. *Proceedings of the SPIE*, vol. 5756, (2005), 368-377.

Takigawa, Tadahiro , et al., "The Road to X Success: Toshiba Machine Equipment Support", *Power Point Presentation*, (2001), 13 pages.

Teig, Steven L., "The X architecture: not your father's diagonal wiring", Proceedings of the 2002 international workshop on System-level interconnect prediction, (2002), 33-37.

* cited by examiner

PHOTOLITHOGRAPHIC TECHNIQUES FOR PRODUCING ANGLED LINES

CROSS REFERENCE TO RELATED APPLICATIONS

This application is a divisional under 37 C.F.R. 1.53(b) of U.S. application Ser. No. 10/215,214 filed Aug. 8, 2002, which is incorporated herein by reference.

This application is also related to the following commonly assigned U.S. patent application which is herein incorporated by reference in its entirety:

"Three Terminal Magnetic Random Access Memory," Ser. No. 09/940,976, filed on Aug. 28, 2001.

TECHNICAL FIELD

This disclosure relates generally to integrated circuits, and more particularly, to semiconductor photolithographic processes.

BACKGROUND

Photolithographic processes in the semiconductor industry use raster scanning methods to produce masks. FIG. 1 illustrates a schematic diagram of a known raster-based photolithographic system. One example of a raster-based photolithographic process is an electron beam (e-beam) process. In an e-beam system 102, for example, a reticle 104 is placed on a table 106 which provides a motion to the reticle along a Y axis using a data set 108 and a worktable motion control module 110, and an electronic beam 112 sweeps back and forth along an X axis using the data set 108 and an e-beam control module 114 to provide a raster motion. The system performs raster-based imaging by sweeping the e-beam back and forth along the X axis, turning the e-beam on over designated areas and off until the next designated area, and appropriately stepping the worktable along the Y axis.

Raster-based photolithographic processes are limited to generating only orthogonal line patterns. With respect to an e-beam system, for example, the size of images is limited to integer multiples of the e-beam spot size. The e-beam spot size can be considered to be a pixel of the pattern. A series of stepped images is used to form lines at non-orthogonal angles with respect to a base direction.

FIG. 2 illustrates a stepped angled image formed using the known raster-based photolithographic system of FIG. 1. In this figure, parallel non-orthogonal lines are drawn at an angle of about 45° with respect to the base direction, which functions as a reference. The pattern is built by writing a spot 203 in the X direction, a spot 205 in the Y direction, a spot 207 in the X direction, and so on.

One problem associated with forming non-orthogonal lines using a raster-based photolithographic process is that the non-orthogonal lines require a larger area than the orthogonal lines. Although the minimum horizontal or vertical line width is equal to an e-beam spot size (pixel), the stepped 45° line (a slope of 1:1) requires two pixels 209 and 211, and the space between parallel 45° lines also requires two pixels 213 and 215. In an image containing parallel 30° lines, for example, even more space is required for the lines and the space between the lines.

Another problem associated with forming non-orthogonal lines using a raster-based photolithographic process is that the lines are formed with uneven edges. Although some smoothing of line edges occur during the exposure and development of the mask, the line might not smooth completely depending on the resist sensitivity. The result is an uneven line edge.

Other problems associated with forming non-orthogonal lines using a raster-based photolithographic process involve the use of more metal to form a stepped diagonal line than a minimum width diagonal line. Additionally, writing stepped images which requires a number of e-beam sweeps is less efficient than writing an orthogonal line that requires only one sweep.

Most semiconductor chip layouts are successfully designed using orthogonal lines. When a small number of non-orthogonal lines are required in a layout, they have been formed using stepped images. However, the problems associated with using stepped images to form non-orthogonal lines are exacerbated when a design requires more non-orthogonal lines to be formed in a smaller space.

Therefore, there is a need in the art to provide improved photolithographic techniques to form angled lines.

SUMMARY

The above mentioned problems are addressed by the present subject matter and will be understood by reading and studying the following specification. The present subject mater provides improved photolithographic techniques to form non-orthogonal (angled) lines on workpieces such as wafers and reticles. The present subject matter allows non-orthogonal lines to be formed at the same thickness as the orthogonal lines (a minimum width corresponding to a pixel or e-beam spot, for example) so as to promote higher density designs, to be formed with even line edges, and to be formed efficiently.

Various embodiments of the preset subject matter involve forming non-orthogonal lines on a reticle. The non-orthogonal lines in the reticle result in non-orthogonal lines in a wafer. Various embodiments of the present subject matter involve rotating the relative position between a wafer and a reticle (by rotating the wafer and/or reticle) to form non-orthogonal lines on the wafer using orthogonal lines on the reticle. Various embodiments of the present subject matter involve directly writing non-orthogonal lines on a rotated wafer.

One aspect of the present subject matter relates to a method for forming non-orthogonal images in a raster-based photolithographic system. According to various embodiments of the method, a first image corresponding to a first data set is formed on a reticle when the reticle is at a first rotational position $\theta_1$. The reticle is adjusted to a second rotational position $\theta_2$. A second image corresponding to a second data set is formed on the reticle when the reticle is at the second rotational position $\theta_2$. The second image is non-orthogonal with respect to the first image.

One aspect of the present subject matter relates to a method for forming an integrated circuit metallization layer using a damascene process and direct write raster-based photolithographic system using an electron beam or other similar means. According to various embodiments of this method, an insulator layer is deposited on a wafer, and a layer of resist is deposited on the insulator layer. A first image corresponding to a first data set is formed on the layer of resist when the wafer is at a first rotational position $\theta_1$ with respect to a reference. The wafer is adjusted to a second rotational position $\theta_2$ with respect to the reference. A second image corresponding to a second data set is formed on the first layer of resist when the reticle is at a second rotational position $\theta_2$. The second image is non-orthogonal with respect to the first image. The first image and the second image are developed, and the wafer is processed using a damascene metal fill to form a metallization layer based on the developed first image and the developed second image.

One aspect of the present subject matter relates to a method for forming integrated circuit metallization layers. According to various embodiments of the method, a first metal layer is deposited on a wafer, and a first layer of resist is deposited on the first insulator layer. A first image corresponding to a first data set on a first reticle is formed on the layer of resist when the wafer is at a first rotational position $\theta_1$ with respect to a reference. The first image is developed, and the wafer is processed to form a portion of the first metallization layer based on the developed first image. A second resist layer is deposited over the first metallization layer. A second reticle is registered to a second rotational position $\theta_2$ with respect to the reference. A second image corresponding to a second data set is formed on the second layer of resist when the wafer is at the second rotational position $\theta_2$. The second image is non-orthogonal with respect to the first image. The second image is developed, and the reticle is processed to form a complete metallization layer based on the developed second image. This may be accomplished either by rotating the reticle with respect to the wafer or the wafer with respect to the reticle. One of ordinary skill in the art will understand, upon reading and comprehending this disclosure, that non-orthogonal metallization layer can be formed when the reticle has non-orthogonal images (formed by rotating the reticle with respect to the raster-based system), can be formed by rotating the wafer or reticle with respect to the raster-based system to form non-orthogonal lines when the reticle is formed with orthogonal images, and can be formed by rotating the wafer with respect to the raster-based system and directly writing onto the wafer using the raster-based system.

One aspect of the present subject matter relates to a method for forming a magnetic random access memory (MRAM) array. According to various embodiments of the method, an image of a first wiring layer of approximately parallel conductors is formed in a first reticle. An image of a second wiring layer of approximately parallel conductors is formed in a second reticle such that the conductors of the second wiring layer would cross with the conductors of the first wiring layer at a number of intersections. An image of a third wiring layer of approximately parallel conductors is formed in a third reticle such that the conductors of the third wiring layer would cross the conductors of the first wiring layer and the second wiring layer at the number of intersections. The three reticles are used to process three successive metal layers. A layer of magnetic storage elements is provided such that the storage elements are proximately located to the intersections and are adapted to be written by a first magnetic field produced by energized conductors in the first wiring layer, a second magnetic field produced by energized conductors in the second wiring layer, and a third magnetic field produced by energized conductors in the third wiring layer. At least one of the first wiring layer, the second wiring layer and the third wiring layer is formed after adjusting an rotational position ($\theta$) of the reticle so as to be non-orthogonal with respect to at least one of the other wiring layers. One of ordinary skill in the art will understand, upon reading and comprehending this disclosure, that a non-orthogonal metallization layer can be formed when the reticle has non-orthogonal images (formed by rotating the reticle with respect to the raster-based system), can be formed by rotating the wafer or reticle with respect to the raster-based system to form non-orthogonal lines when the reticle is formed with orthogonal images, and can be formed by rotating the wafer with respect to the raster-based system and direct writing onto the wafer using the raster-based system.

One aspect of the present subject matter relates to a raster-based photolithographic system for forming orthogonal and non-orthogonal images on reticles. According to various embodiments, the system includes an imager and a worktable adapted to function to orthogonally image a workpiece (such as a reticle or a wafer) in an X direction and a Y direction using a raster motion. The imager and the worktable also are adapted to adjust a rotational position of the workpiece with respect to the raster motion. The system further includes a database, and an X-controller, a Y-controller, and a $\theta$-controller. The database includes a first data set for writing an orthogonal image with respect to the raster motion and a second data set corresponding for writing a non-orthogonal image with respect to the raster motion. The X-controller is adapted to control imaging of reticles or direct writing of wafers in an X direction. The Y-controller is adapted to control imaging of reticles or direct writing of wafers in a Y direction. The $\theta$-controller is adapted to control an adjustment of the rotational position of the workpiece (reticle or wafer) with respect to the raster motion.

These and other aspects, embodiments, advantages, and features will become apparent from the following description of the present subject matter and the referenced drawings.

DETAILED DESCRIPTION

Figure 1:
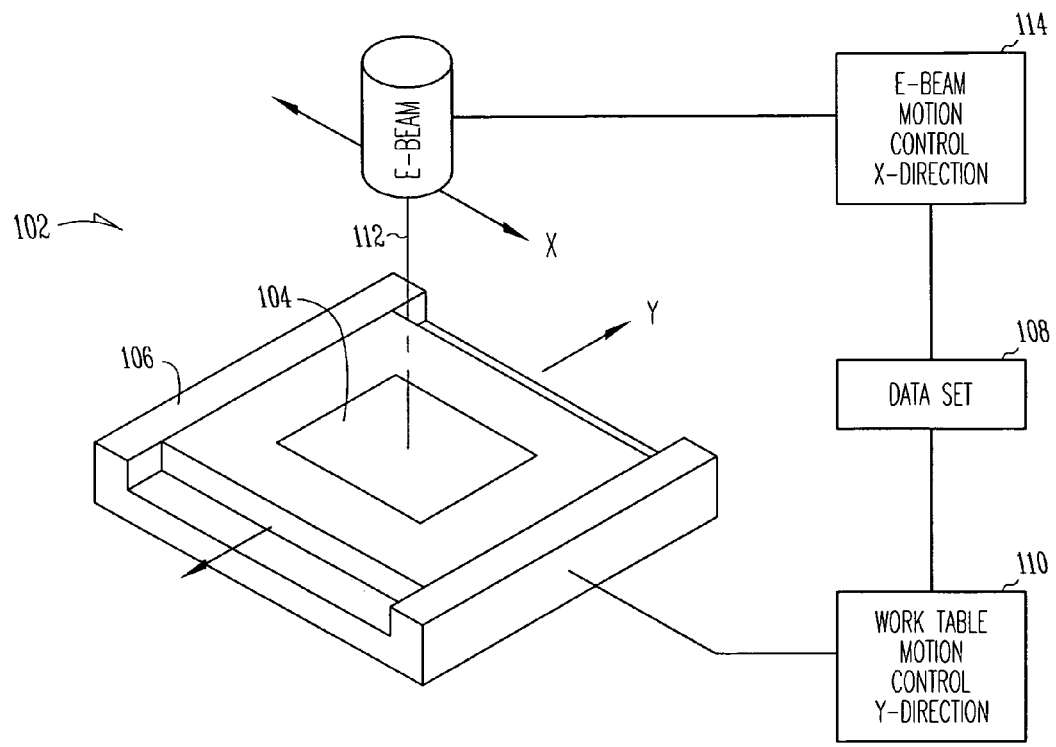
FIG. 1 illustrates a schematic diagram of a known raster-based photolithographic system.
Figure 2:
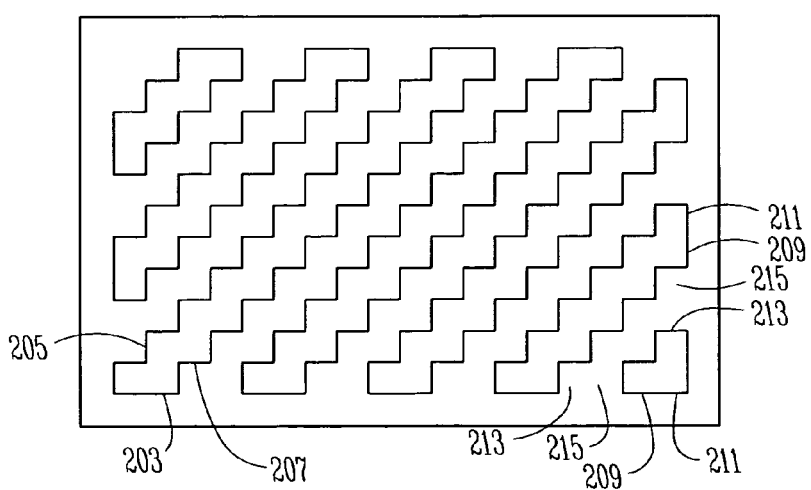
FIG. 2 illustrates a stepped angled image formed using the known raster-based photolithographic system of FIG. 1.

The following detailed description refers to the accompanying drawings which show, by way of illustration, specific aspects and embodiments in which the present subject matter may be practiced. These embodiments are described in sufficient detail to enable those skilled in the art to practice the present subject matter. Other embodiments may be utilized and structural, logical, and electrical changes may be made without departing from the scope of the present subject matter. The following detailed description is, therefore, not to be taken in a limiting sense, and the scope of the present subject matter is defined only by the appended claims, along with the full scope of equivalents to which such claims are entitled.

The term "substrate" used in the following description may include any semiconductor-based structure that has an exposed surface. The structure may include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. A wafer is a slice of semiconductor material from which chips are made, and thus form a substrate. When reference is made to a wafer or substrate in the following description, previous process steps may be utilized to form regions, junctions, or layers in or on the base semiconductor or foundation.

One definition of raster is a scan/write pattern in which an area is scanned/written from side to side in lines from top to bottom (or bottom to top). A raster-based photolithographic system, such as an e-beam system, writes an image on a line along an X axis, increments to a new line along a Y axis, writes an image on the new line, and so on to form the overall image. Since the degrees of motion lie in the X direction and the Y direction, the raster-based photolithographic system provides orthogonal images. Orthogonal images are images that, at their smallest pixel level, involve orthogonal lines along the X axis and the Y axis. As is known in the art such raster based electron beam systems are used to produce the reticles used in the modem step and repeat and step and scan photo tools. They are also used in direct write electron beam expose tools.

The present subject matter effectively rotates a workpiece such that non-orthogonal images are capable of being written on the workpiece. In various embodiments, the present subject matter effectively rotates the reticle blank such that non-orthogonal images are capable of being written on the reticle. In various embodiments, the reticle is rotated with respect to the orthogonal directions of motion for the e-beam and the worktable.

In various embodiments, the present subject matter effectively rotates a wafer such that non-orthogonal images are capable of being directly written on the wafer. In various embodiments, the wafer is rotated with respect to the orthogonal directions of motion for the e-beam and the worktable.

In various embodiments, the present subject matter effectively rotates the mask such that non-orthogonal images are capable of being written on the wafer. In various embodiments, the wafer is rotated with respect to the orthogonal directions of the mask axes.

Figure 3:
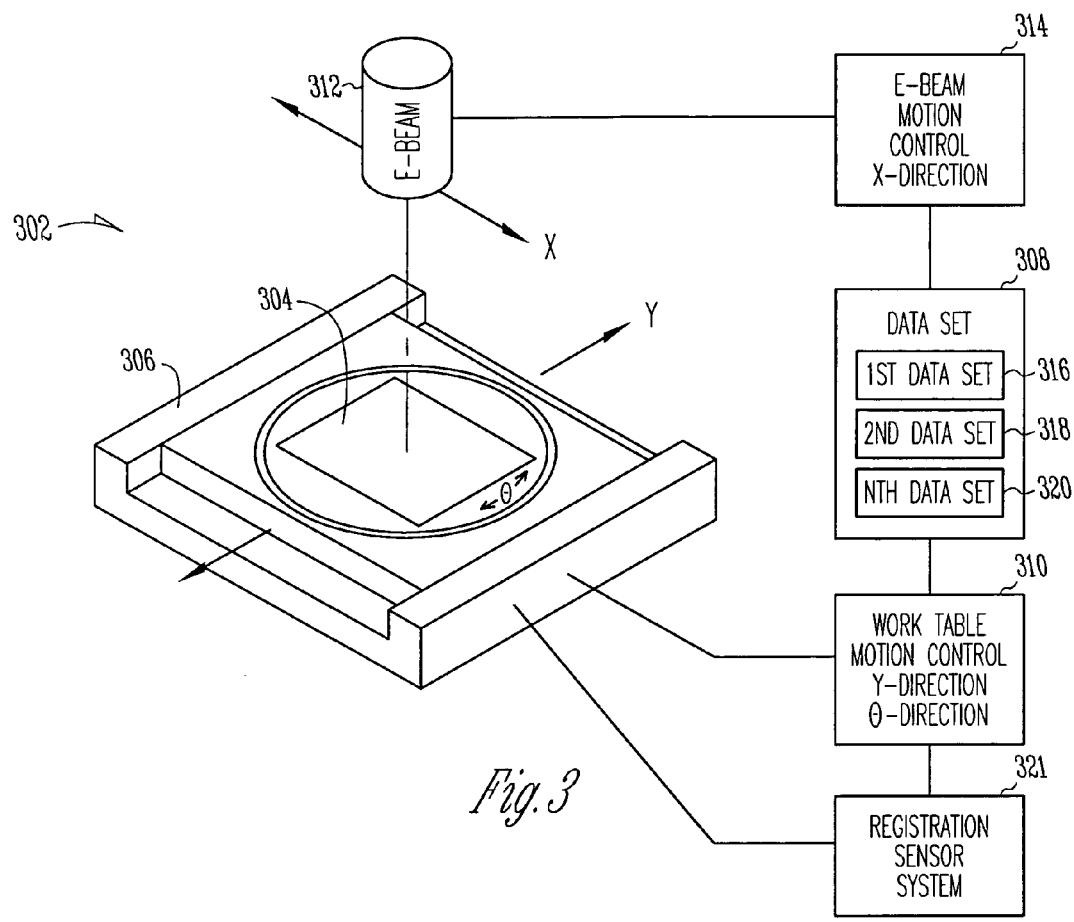
FIG. 3 illustrates a schematic diagram of a raster-based photolithographic system according to various embodiments of the present subject matter.

FIG. 3 illustrates a schematic diagram of a raster-based photolithographic system according to various embodiments of the present subject matter. The illustrated system 302 includes a worktable 306 which is adapted to receive a reticle 304 and to provide a linear motion to the reticle along a Y axis using a data set 308 (such as may be contained in a programmable computer) and a worktable control module 310. The illustrated system 302 also includes an electronic beam 312 that sweeps back and forth along an X axis using the data set 308 and an e-beam control module 314 to perform the raster scan. One of ordinary skill in the art will understand the system 302 includes the required technology to produce and focus the electronic beam 312.

The worktable 306, or holder, of the reticle 302 is capable of linear motion (i.e. Y axis motion) and, according to various embodiments, is capable of having a rotational angle ($\theta$) adjusted. Thus, the worktable 306 is capable of being at a first predetermined rotational position $\theta_1$ for imaging orthogonal lines on the reticle, and is capable of being at a second predetermined rotational position $\theta_2$ for imaging non-orthogonal lines on the reticle. One or ordinary skill in the art will understand, upon reading and comprehending this disclosure, that a number of systems are capable of being used to provide the reticle 302 with a desired rotational position.

According to various embodiments, the worktable 306 is capable of being at a number of other rotational positions. According to various embodiments, the worktable is capable of being accurately moved or stepped through a number of rotational positions from rotational position $\theta_1$ to rotational position $\theta_2$. In various embodiments, the worktable motion control module 310 is adapted to control the rotational motion and position of the reticle 302. In various embodiments, a registration sensor system 321 is used to accurately detect the position of the reticle, and to work with at least one of the control modules 310 and 314 to adjust the position of the reticle 304 or otherwise register the image on the reticle. For example, the registration sensor system 321 is capable of finely adjusting the rotation of the worktable and/or adjusting the deflection of the e-beam such that a number of images are accurately printed with respect to each other.

One of ordinary skill in the art will understand, upon reading and comprehending this disclosure, that the superimposed chip image is sized and/or designed to fit in the usable area of the reticle 302 regardless of the rotational position of the reticle. The chip image pattern is produced using at least two data sets 316 and 318. A first data set 316 is used to pattern first images (e.g. orthogonal images) when the reticle 304 is at a first rotational position $\theta_1$. The orthogonal images, for example, can be viewed as having horizontal and vertical directions that are consistent with previous chip levels. A second data set 318 is used to pattern second images (non-orthogonal or angled) when the reticle is at a second rotational position $\theta_2$. Additional data sets (N) 320 are capable of being used to pattern non-orthogonal images when the reticle is at an Nth rotational position $\theta_N$. The data sets are operated on by a programmable computer to provide the image patterns. One of ordinary skill in the art will understand, upon reading and comprehending this disclosure, that the superimposed chip image may be formed either directly on a wafer or other substrate, or on a reticle which will be used to expose a wafer or other substrate.

Figure 4:
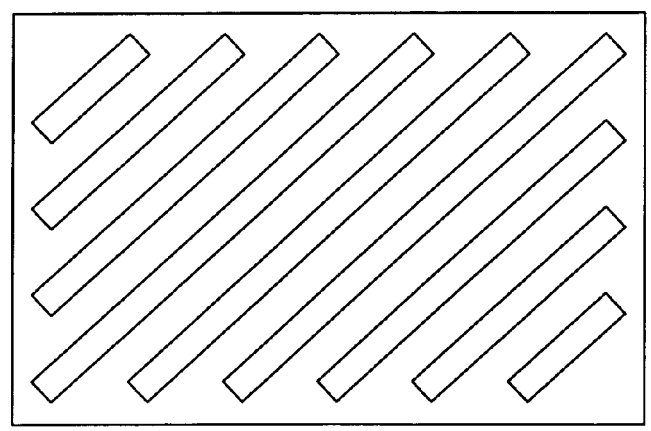
FIG. 4 illustrates an angled image formed according to various embodiments of the present subject matter using the raster-based photolithographic system of FIG. 3.

FIG. 4 illustrates an angled image formed according to various embodiments of the present subject matter using the raster-based photolithographic system of FIG. 3. One of ordinary skill in the art will understand, upon reading and comprehending this disclosure, that the resulting non-orthogonal image has angled lines with even edges, and that the lines and the spaces are imaged to a minimum thickness corresponding to the dimensions of the e-beam spot. Additionally, each of the lines are capable of being formed with one e-beam scan motion, and as such are efficiently formed.

Raster-based photolithographic systems are capable of aligning sub-fields to, for example, place two or more chip images on a single reticle. One of ordinary skill in the art will understand, upon reading and comprehending this disclosure, how to register a reticle to accurately image a number of sub-fields with respect to each other. Thus, one of ordinary skill in the art will understand, upon reading and comprehending this disclosure, how to align the first image corresponding to the first data set 316 with the second image corresponding to the second data set 318.

Figure 5:
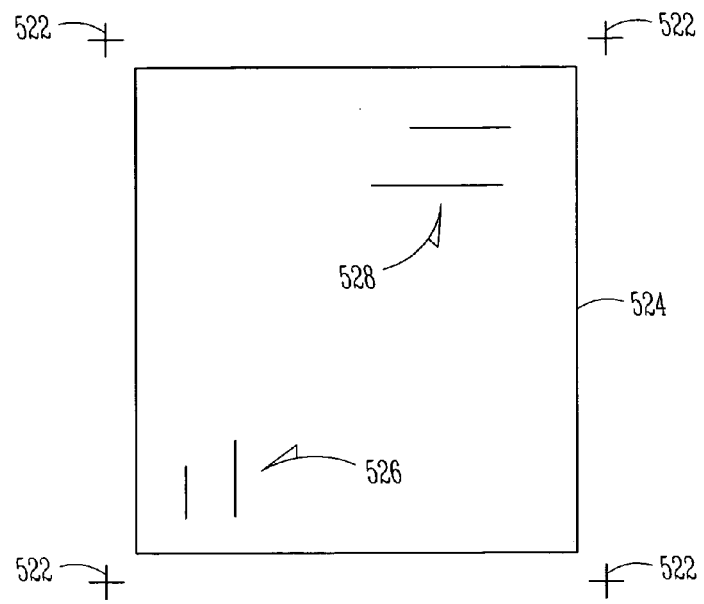
FIG. 5 illustrates a schematic representation of a first image formed on a reticle using a first data set in a raster-based photolithographic system.

FIG. 5 illustrates a schematic representation of a first image formed on a reticle using a first data set in a raster-based photolithographic system. In the illustrated embodiment, the area 524 of the first data set (less the alignment markings) corresponds with the usable area of the reticle.

According to various embodiments, alignment markings 522 on the reticle 524 are used to properly position the image produced by the second data set with the image produced by the first data set. In various embodiments, for example, the alignment markings are included in the first data set and are incorporated in the orthogonal first image. Thus, the markings 522, the vertical lines 526 of the orthogonal first image, and the horizontal lines 528 of the orthogonal first image are imaged or printed together. These alignment markings 522 from the first data set are used to align the second image that corresponds to the second data set.

In various embodiments, for example, the alignment markings 522 are preprinted or otherwise incorporated on the reticle 524. These preprinted alignment markings 522 are used to properly position the image of the first data set and are used to properly position the image of the second data set.

In various embodiments, for example, the alignment markings 522 include crosses at each corner of the chip. In various embodiments, the crosses are positioned on a line that bisects the corner angle of the reticle/chip. One of ordinary skill in the art will understand that other alignment markings are able to be used, and that other methods for registering the position of the reticle are anticipated. In various embodiments, the registration sensor system 321 of FIG. 3 is used to accurately detect the position of the reticle, and to function with at least one of the control modules 310 and 314 to adjust the position of the reticle 304 or otherwise register the image on the reticle.

Figure 6:
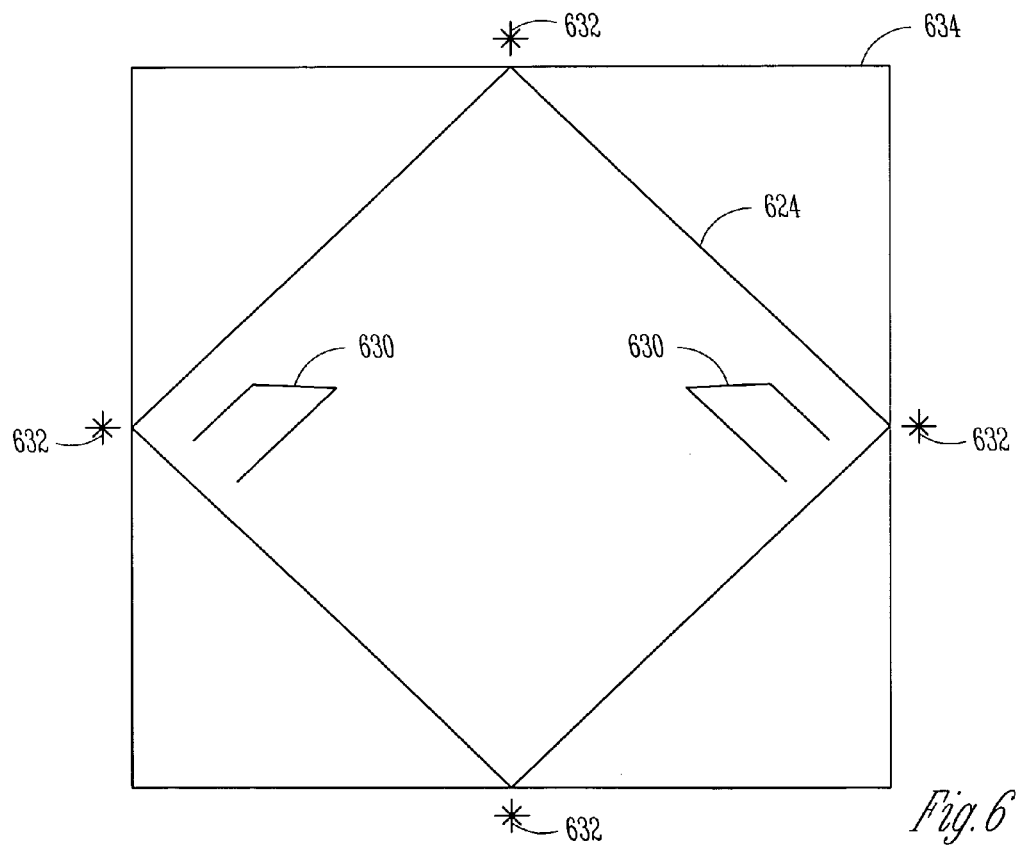
FIG. 6 illustrates a schematic representation of a second image formed on a rotated reticle (after the first image is formed in FIG. 5) using a second data set in the raster-based photolithographic system.

FIG. 6 illustrates a schematic representation of a second image formed on a rotated reticle (after the first image is formed in FIG. 5) using a second data set in the raster-based photolithographic system. The second data set is rotated with respect to the first data set so that the angled lines are vertical/horizontal lines 630 with appropriate alignment markings 632. The alignment markings 632 are coincident with the alignment markings 522 (shown in FIG. 5) when superimposed on the first data set.

The total area of the second data set is shown via line 634. However, there is no data (i.e. lines) outside of the area 624 of the rotated first data set, except for the alignment markings 632. The imaged lines 630 from the second data set are illustrated to connect the imaged lines from the first data set.

In the illustrated embodiment, the exposure field of the e-beam system is as large as area 634 for the second data set, including the alignment markings. The reticle size needs only be as big as the first data set, including the alignment markings.

The actual production of the reticle can be done on a number of ways, depending upon the type of alignment system used to align the e-beam fields. In various embodiments, the first data set is printed upon the resist on the plate, and the plate is removed from the system and the resist is developed and the plate metallurgy etched. A new layer of resist is applied, the plate is placed back in to the system in a rotated position, and data set two is aligned to the alignment markings. The resist is developed and the plate metallurgy etched.

In various embodiments, alignment markings are pre-positioned on the reticle prior to the first exposure. In this system, the two data sets are aligned to the pre-positioned alignment markings. The first data set is used followed by the required mask rotation and then the second data set is used for the second exposure.

One or ordinary skill in the art, upon reading and comprehending this disclosure, will understand that a process sequence similar to the sequence used in the illustrated production of a reticle in FIGS. 5 and 6 can be used in the raster beam direct write of a wafer or other substrate. Additionally, one of ordinary skill in the art will understand, upon reading and comprehending this disclosure, how to rotate the relative position of the wafer with respect to the reticle to produce non-orthogonal lines on the wafer when the reticle has an orthogonal image.

The systems and methods of the present subject matter are capable of being used to form a magnetic random access memory (MRAM) array such as that provided by the patent application entitled "Three Terminal Magnetic Random Access Memory," Ser. No. 09/940,976, filed on Aug. 28, 2001, which was previously incorporated by reference in its entirety. As discussed therein, the three terminal MRAM significantly diminishes half-select errors by energizing three lines (a word line, a bit line and a select line) rather than two lines to access a selected bit. At least one of the three lines is non-orthogonal with respect to the other lines.

Figure 7:
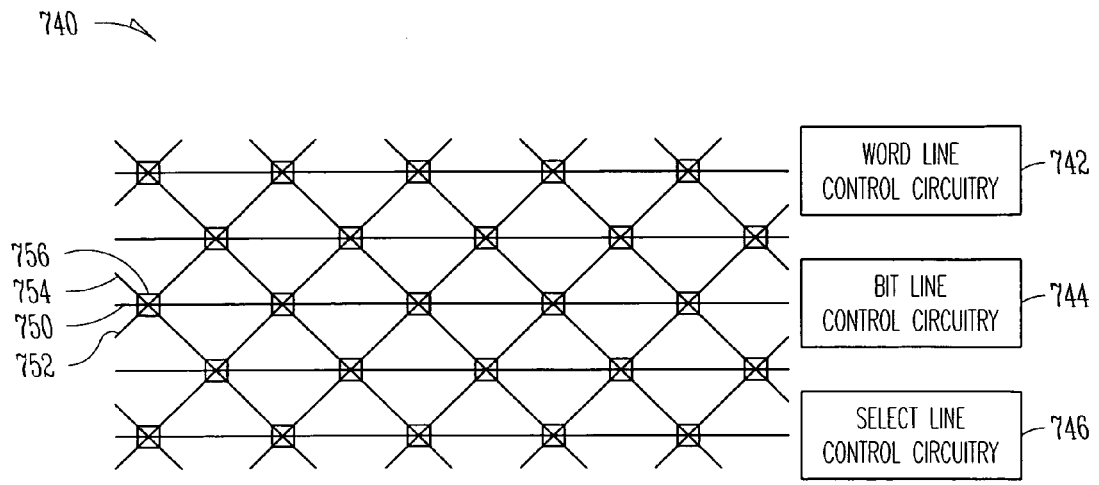
FIG. 7 illustrates a MRAM according to various embodiments of the present subject matter with magnetic memory cells or storage devices located at intersections among bit lines, word lines and select lines in a cross point array.
Figure 8:
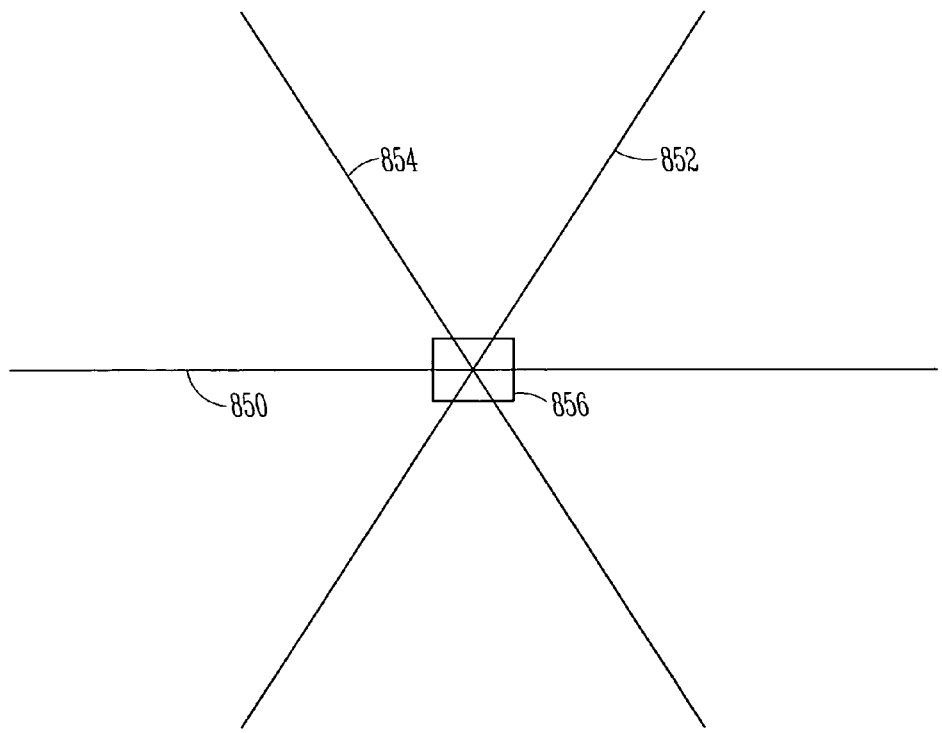
FIG. 8 illustrates an intersection in the cross point array of FIG. 7 in more detail.
Figure 9:
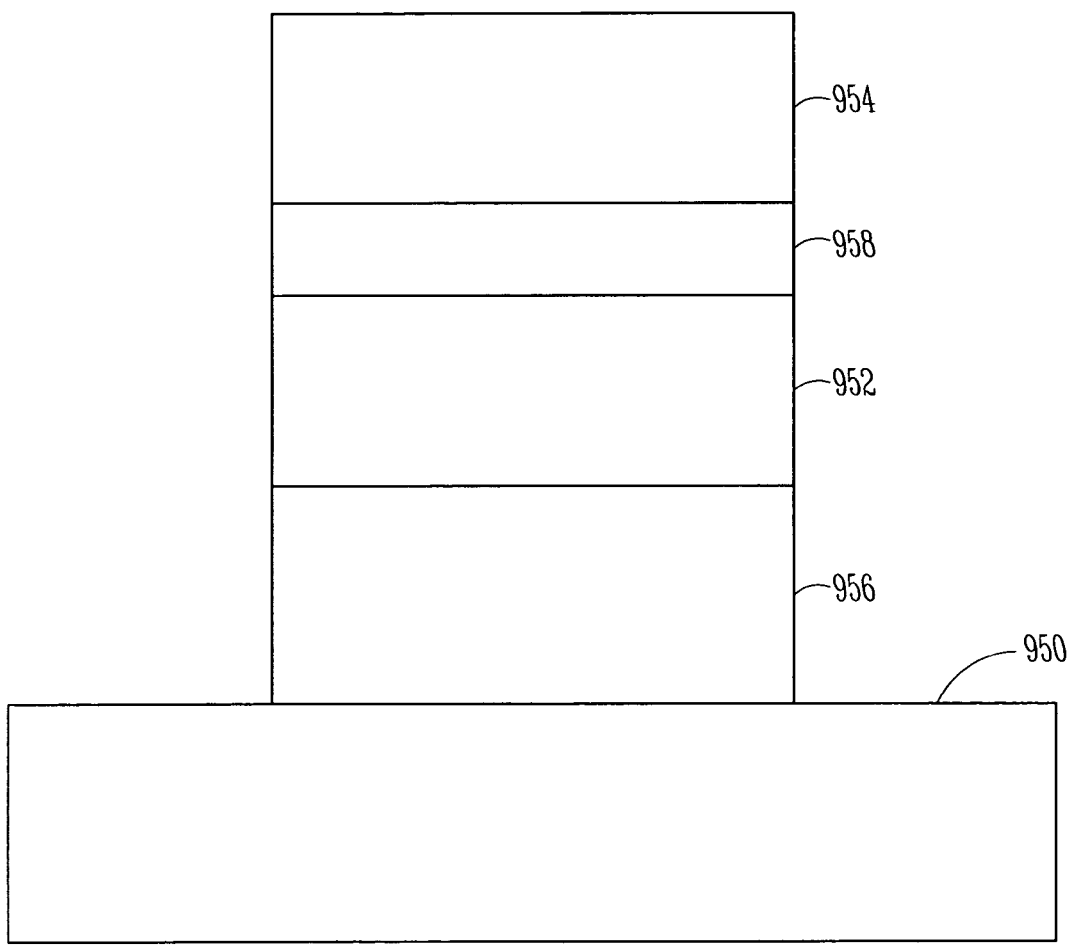
FIG. 9 illustrates a structure for various embodiments of the cross point array of FIG. 7.

FIGS. 7–9 illustrate various aspects for forming a three terminal magnetic random access memory.

FIG. 7 illustrates a MRAM with magnetic memory cells or storage devices located at intersections among bit lines, word lines and select lines in a cross point array. The illustrated MRAM 740 includes Word Line Control Circuitry 742, Bit Line Control Circuitry 744, and Select Line Control Circuitry 746. These control circuits control the current direction and magnitude on the conductors, cooperate with each other to write to a desired magnetic storage device by providing the appropriate current to a word line conductor 750, a bit line conductor 752, and a select line conductor 754 that corresponds to the desired magnetic storage device 756. The magnetic storage device is capable of being magnetically coupled to a magnetic field generated by current in the word line, bit line and select line conductors.

According to various embodiments, the word line conductors are oriented at an angle of approximately 60° with the bit line conductors and the select line conductors, and the bit line conductors are oriented at an angle of approximately 60° with the select line conductors. The MRAM 740 is characterized as a three terminal MRAM, as it includes requires a terminal to control the word line conductors 750, a terminal to control the bit line conductors 752, and a terminal to control the select line conductors 754. All three conductors are energized to write to a desired memory cell 756.

FIG. 8 illustrates an intersection in the cross point array in more detail. This intersection represents a memory cell, and includes a magnetic storage element 856, a word line conductor 850, a bit line conductor 852, and a select line conductor 854.

FIG. 9 illustrates a structure for one embodiment of the cross point array of FIG. 7. In this embodiment, a properly insulated magnetic storage element 956 is interposed between a bit line 952 and a word line 950 at each intersection. A select line 954 also passes operably close to the magnetic storage element 956 at the intersection. According to various embodiments, the array is fabricated by forming or otherwise providing a word line layer, a storage element layer on the word line layer, a bit line layer on the storage element layer, an insulator layer 958 on the bit line layer, and a select line layer on the insulator layer. The magnetic storage element is capable of being magnetically coupled by a magnetic field generated by a current in each of these layers. One of ordinary skill in the art will understand, upon reading and comprehending this disclosure, that other structural designs are capable of being used to magnetically couple the magnetic storage element 956 with the magnetic fields produced by energizing the three lines. According to various embodiments, the magnetic storage element is a magnetoresistance device, and is electrically coupled to the word line and the bit line.

Figure 10C:
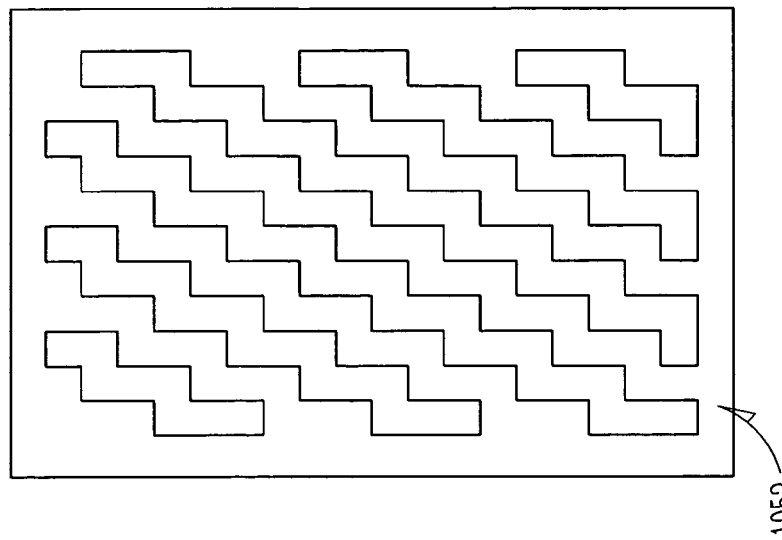
FIGS. 10A, 10B and 10C illustrate horizontal word lines, angled select lines, and angled bit lines, respectively, formed using the known raster-based photolithographic system of FIG. 1.
Figure 10B:
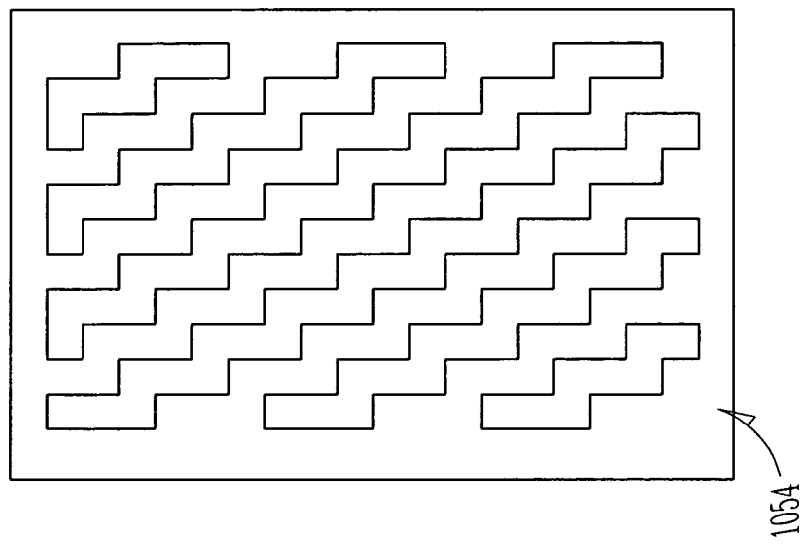
Figure 10A:
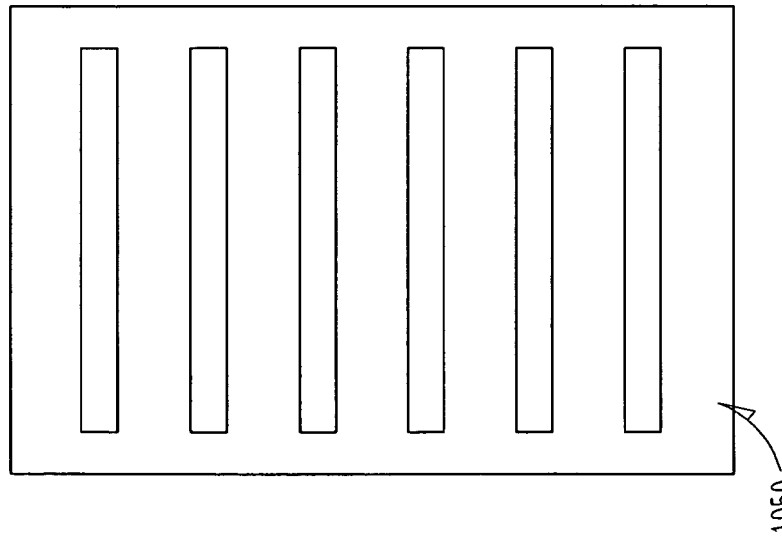

FIGS. 10A, 10B and 10C illustrate horizontal word lines, angled select lines, and angled bit lines, respectively, formed using the known raster-based photolithographic system of FIG. 1. FIGS. 10A, 10B and 10C are stacked together to form the array shown in FIG. 7. The word lines 1050 of FIG. 10A, the select lines 1054 of FIG. 10B, and the bit lines 1052 of FIG. 10C form metallization layers, and cross each other at intersections such as is illustrated in FIGS. 7–9.

The angled select lines 1054 and the angled bit lines 1052 are stepped images, which require more than a minimum feature size to form the lines and to separate the lines. Since both the angled select lines 1054 and the angled bit lines 1052 are separated by a greater distance, the select lines 1054 and the bit lines 1052 cross and form intersections fewer times in a given area. The horizontal lines 1050 cross the angled select lines 1054 and the angled bit lines 1052 at the intersections, and thus are separated by a distance greater than a minimum distance that corresponds to the pixel width or e-beam spot width. Six word lines, six select lines and six bit lines fit within the area illustrated in FIGS. 10A–10C.

Figure 11A:
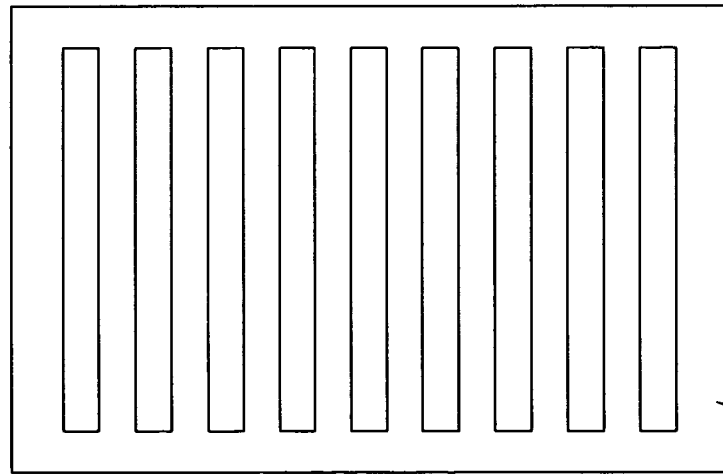
FIGS. 11A, 11B and 11C illustrate horizontal word lines, non-orthogonal select lines, and non-orthogonal bit lines, respectively, formed according to various embodiments of the present subject matter using the raster-based photolithographic system of FIG. 3.
Figure 11B:
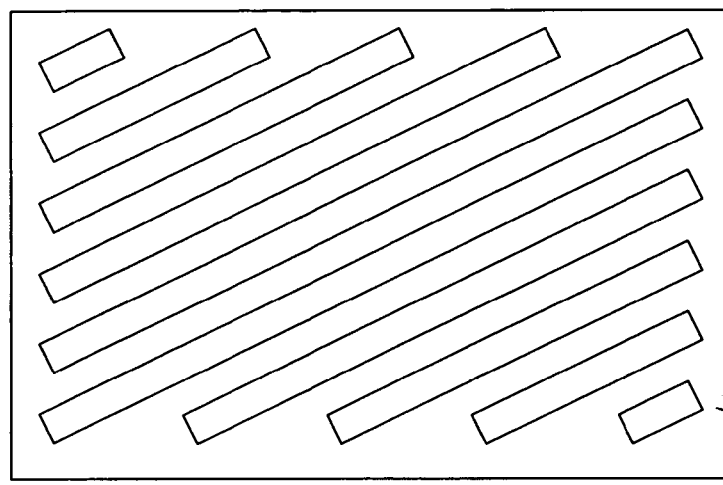
Figure 11C:
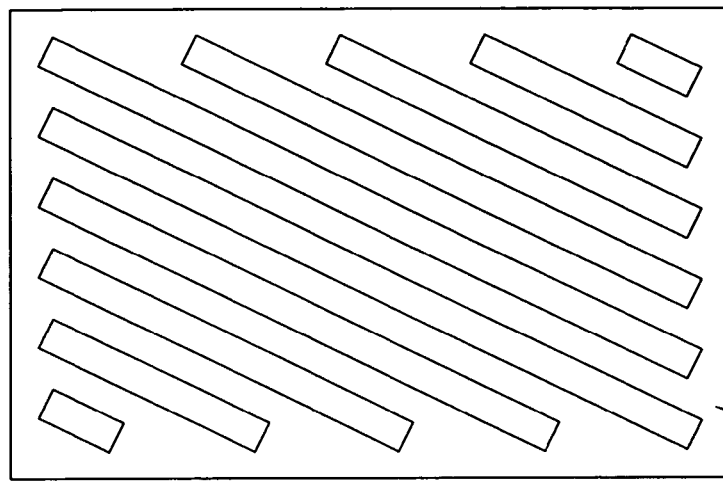

FIGS. 11A, 11B and 11C illustrate horizontal word lines, non-orthogonal select lines, and non-orthogonal bit lines, respectively, formed according to various embodiments of the present subject matter using the raster-based photolithographic system of FIG. 3. The word lines 1150 of FIG. 11A, the select lines 1154 of FIG. 11B, and the bit lines 1152 of FIG. 11C form metallization layers, and cross each other at intersections such as is illustrated in FIGS. 7–9.

The angled select lines 1154 and the angled bit lines 1152 have even edges, and are imaged to a minimum thickness corresponding to the feature size or e-beam spot. Because the parallel angled lines are separated by a minimum distance, the angled select lines 1154 and the angled bit lines 1152 cross and form intersections more times in a given area. The horizontal lines 1150 cross the angled select lines 1154 and the angled bit lines 1152 at the more densely-packed intersections, and thus are capable of being closer together. Nine word lines, ten select lines and ten bit lines fit within the area illustrated in FIGS. 11A–11C, as compared to the six word lines, six select lines and six bit lines fit within the area illustrated in FIGS. 10A–10C. Thus, the present subject matter provides more compact, three-terminal MRAM designs as compared to using stepped angled images from a conventional, raster-based photolithographic system.

System Level

Figure 12:
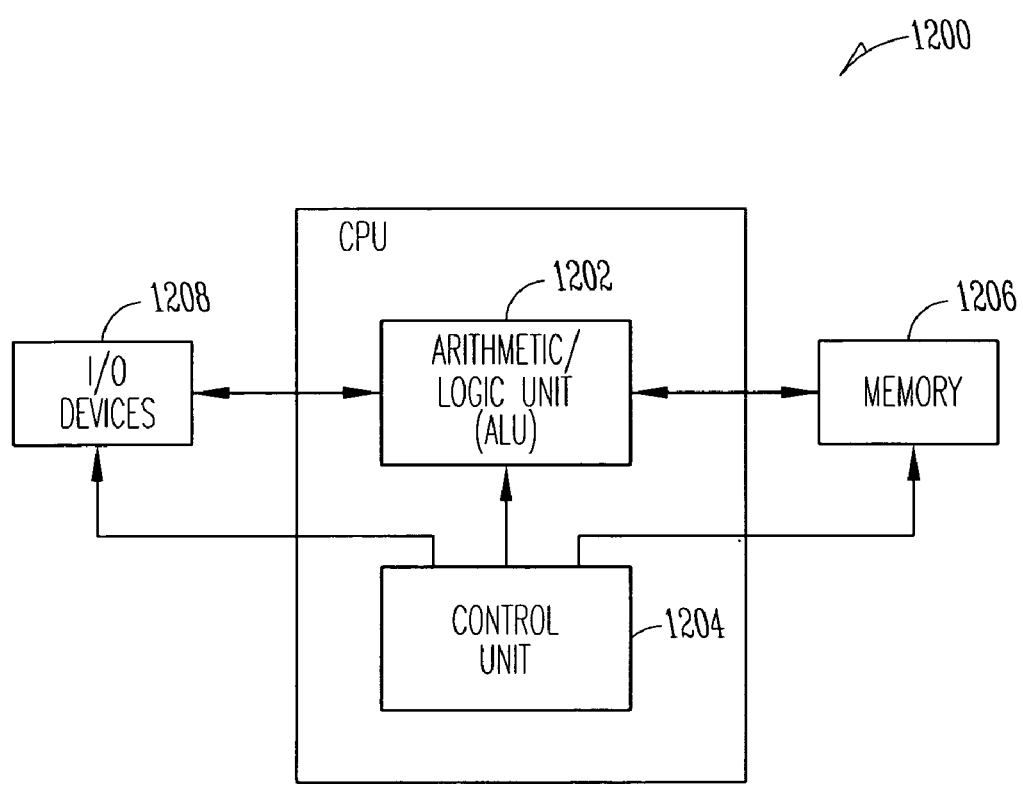
FIG. 12 is a simplified block diagram of a high-level organization of various embodiments of an electronic system according to the present subject matter.

FIG. 12 is a simplified block diagram of a high-level organization of various embodiments of an electronic system according to the present subject matter. In various embodiments, the system 1200 is a computer system, a process control system or other system that employs a processor and associated memory. The electronic system 1200 has functional elements, including a processor or arithmetic/logic unit (ALU) 1202, a control unit 1204, a memory device unit 1206 and an input/output (I/O) device 1208. Generally such an electronic system 1200 will have a native set of instructions that specify operations to be performed on data by the processor 1202 and other interactions between the processor 1202, the memory device unit 1206 and the I/O devices 1208. The control unit 1204 coordinates all operations of the processor 1202, the memory device 1206 and the I/O devices 1208 by continuously cycling through a set of operations that cause instructions to be fetched from the memory device 1206 and executed. According to various embodiments, the memory device 1206 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include a chip produced with non-orthogonal photolithography in accordance with the present subject matter.

The illustration of system, as shown in FIG. 12, is intended to provide a general understanding of one application for the structure and circuitry of the present subject matter, and is not intended to serve as a complete description of all the elements and features of an electronic system that uses non-orthogonal photolithographic processes according to the present subject matter. As one of ordinary skill in the art will understand, such an electronic system can be fabricated in single-package processing units, or even on a single semiconductor chip, in order to reduce the communication time between the processor and the memory device.

Applications that use non-orthogonal photolithographic processes as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Method Aspects

The figures presented and described in detail above are similarly useful in describing the method aspects of the present subject matter. The methods described below are nonexclusive as other methods may be understood from the specification and the figures described above.

Figure 13:
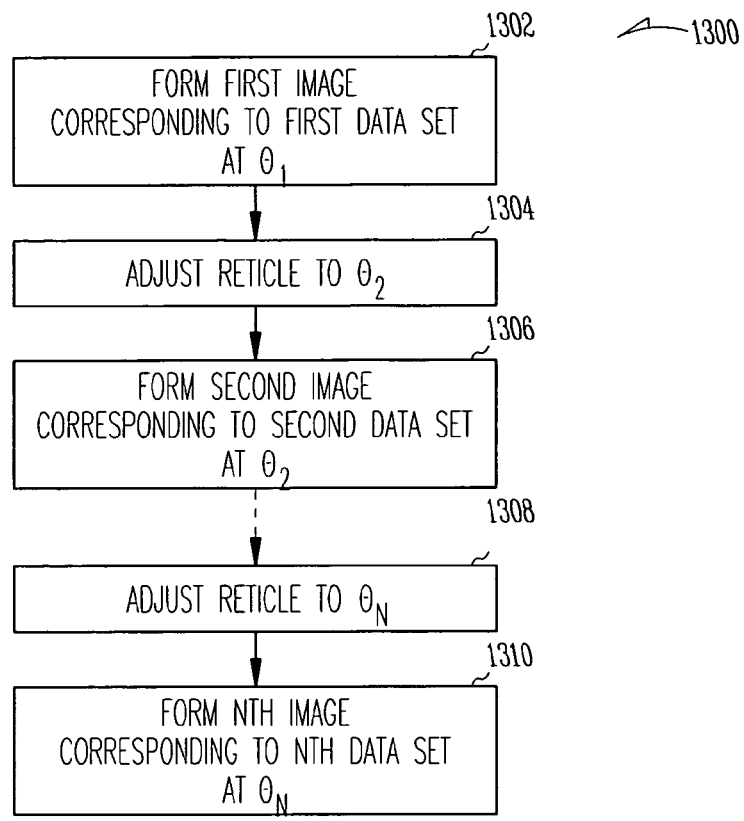
FIG. 13 illustrates a method for forming non-orthogonal images in a raster-based photolithographic system according to various embodiments of the present subject matter.

FIG. 13 illustrates a method for forming non-orthogonal images in a raster-based photolithographic system according to various embodiments of the present subject matter. In the illustrated method 1300, a first image is formed at 1302 when the reticle is at a first rotational angle $\theta_1$. The first image corresponds to a first data set. For example, the first image may be formed to be orthogonal with respect to other photolithographic images on the reticle.

At 1304, the reticle is adjusted to a second rotational angle $\theta_2$. At 1306, a second image corresponding to a second data set is formed when the reticle is at the second rotational angle $\theta_2$. According to various embodiments, the difference between the angles $\theta_2-\theta_1$ is not 0°, 90°, 180° or 270° such that the second image is non-orthogonal with respect to the first image. According to various embodiments, the reticle is adjusted by rotating the worktable from the first rotational angle $\theta_1$ to the second rotational angle $\theta_2$. According to various embodiments, the reticle is adjusted by accurately stepping the worktable through a number of rotational positions from the first rotational angle $\theta_1$ to the second rotational angle $\theta_2$.

Additional images are formed on the reticle in various embodiments. For example, the reticle is adjusted to an Nth rotational position $\theta_N$ at 1308, and at 1310, an Nth image corresponding to an Nth data set is formed on the reticle when the reticle is at the rotational position $\theta_N$.

One of ordinary skill in the art will understand, upon reading and comprehending this disclosure, how to substitute a wafer or other workpiece for the reticle shown in FIG. 13 for a direct write electron beam or similar direct write system.

Figure 14:
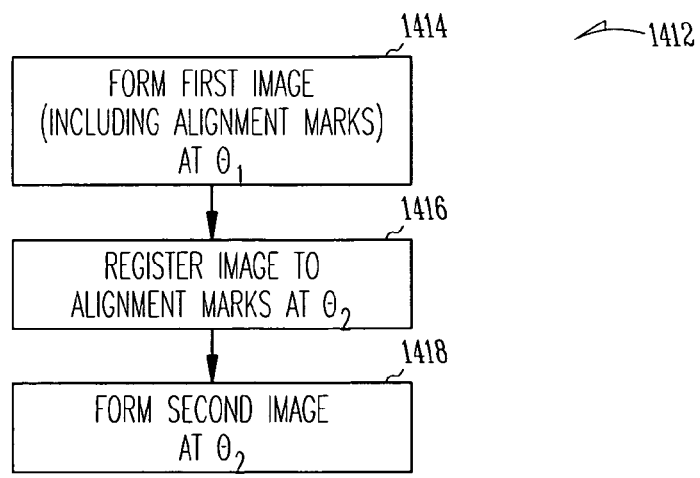
FIG. 14 illustrates a method for aligning the second image with the first image according to various embodiments of the method illustrated in FIG. 13.

FIG. 14 illustrates a method for aligning the second image with the first image according to various embodiments of the method illustrated in FIG. 13. In the illustrated method 1412, a first image includes alignment markings, and is formed on the reticle at 1414 when the reticle is at a first rotational position $\theta_1$. At 1416, the image is positioned at a second rotational position $\theta_2$ and is registered to the alignment markings formed as part of the first image. One of ordinary skill in the art will know how to register to the reticle to the alignment markings. According to various embodiments, the reticle is rotated between the first rotational position $\theta_1$ and the second rotation position $\theta_2$. According to various embodiments, the reticle is accurately stepped through a number of rotational positions between the first rotational position $\theta_1$ and the second rotation position $\theta_2$. At 1418, a second image is formed at $\theta_2$.

Figure 15:
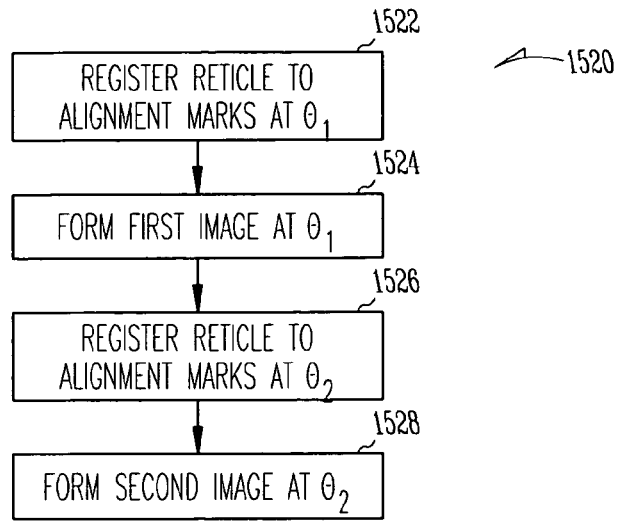
FIG. 15 illustrates a method for aligning the first image and the second image with the reticle according to various embodiments of the method illustrated in FIG. 13.

FIG. 15 illustrates a method for aligning the first image and the second image with the reticle according to various embodiments of the method illustrated in FIG. 13. In the illustrated method 1520, at 1522, the reticle is positioned at a first rotational position $\theta_1$ and is registered to alignment markings already preprinted or otherwise identified on the reticle. At 1524, a first image is formed at the first rotational position $\theta_1$. At 1526, the reticle is positioned at a second rotational position $\theta_2$ and the image is registered to the alignment markings. One of ordinary skill in the art will understand, upon reading and comprehending this disclosure, that in various embodiments, the image used at 1526 is a different image than that used at 1522. At 1528, a second image is formed at the second rotational position $\theta_2$.

Figure 16:
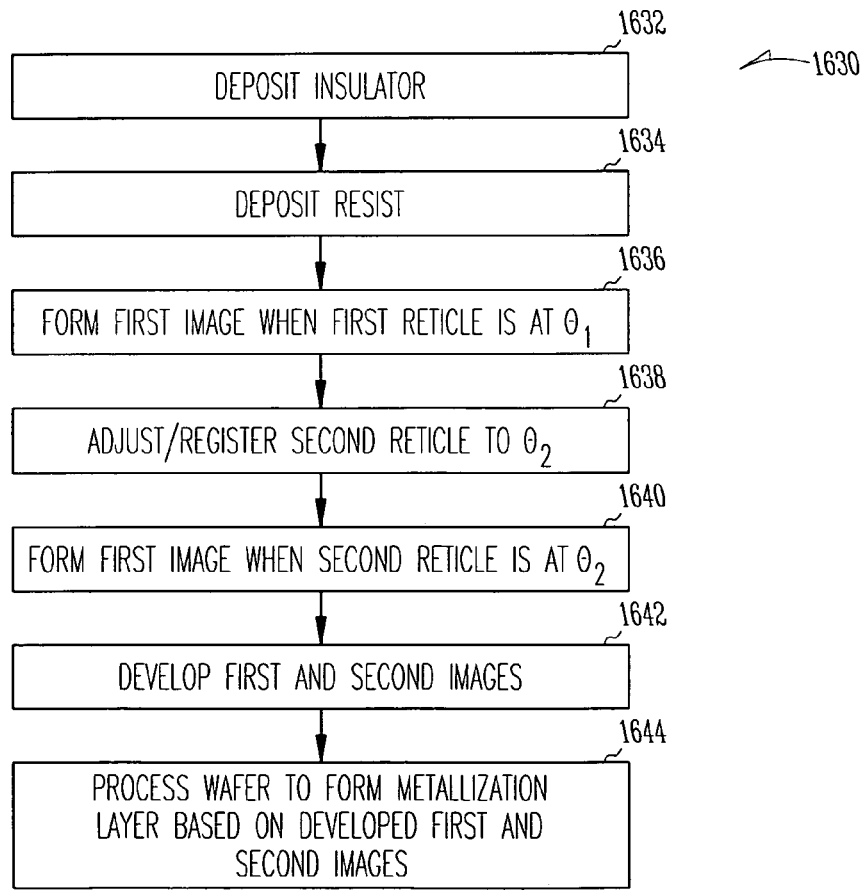
FIG. 16 illustrates a method for forming an integrated circuit metallization layer according to various embodiments of the present subject matter.

FIG. 16 illustrates a method for forming an integrated circuit metallization layer according to various embodiments of the present subject matter. In the illustrated method 1630, an insulator is deposited on a wafer at 1632, and a resist is deposited on the insulator at 1634. At 1636, a first image is formed on the resist when the reticle is at a first rotational position $\theta_1$. At 1638, the second reticle is adjusted and appropriately registered to a second rotational position $\theta_2$. At 1640, a second image is formed on the resist when the reticle is at the second rotational position $\theta_2$. The first and second images are developed at 1642, and at 1644, the wafer is processed to form a metallization layer using the damascene process based on the developed first and second images. One of ordinary skill in the art will understand, upon reading and comprehending this disclosure, that the metallization layer also can be formed using subtractive etch process. Thus, a single metallization layer is capable of including both orthogonal and non-orthogonal lines.

Figure 17:
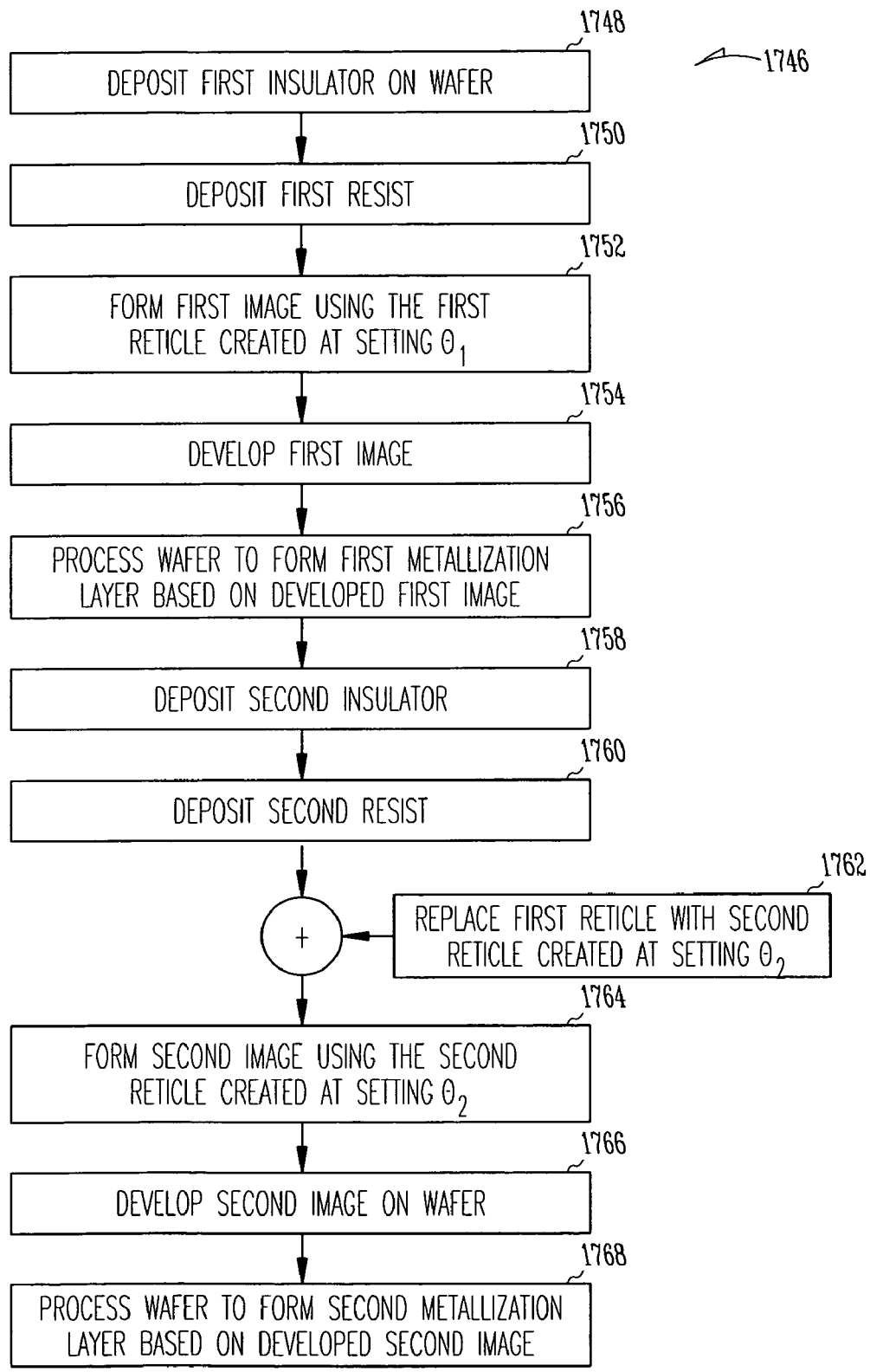
FIG. 17 illustrates a method for forming integrated circuit metallization layers according to various embodiments of the present subject matter.

FIG. 17 illustrates a method for forming integrated circuit metallization layers according to various embodiments of the present subject matter. In the illustrated method 1746, a first insulator is deposited on a wafer at 1748, and a first resist is deposited on the first insulator at 1750. At 1752, a first image is formed on the resist when the first reticle is at a first rotational position $\theta_1$. The first image is developed at 1754, and at 1756, the wafer is processed to form a first metallization layer using the damascene process based on the developed first image. One of ordinary skill in the art will understand, upon reading and comprehending this disclosure, that the wafer can be processed to form the metallization layer using a subtractive etch process. The damascene process and the subtractive etch process are known. Upon reading and comprehending this disclosure, those of ordinary skill in the art will understand how to incorporate the present subject with these processes.

At 1758, a second insulator is deposited on the wafer, and a second resist is deposited on the second insulator at 1760. At 1762, the process uses a second reticle which was imaged registered a second rotational position $\theta_2$. The reticle is appropriately registered to the first level. At 1764, a second image is formed on the resist. The second image is developed at 1766, and at 1768, the wafer is processed to form a metallization layer based on the developed second image. Thus, as the image on the second reticle was placed at an angle to the first, one metallization layer is capable of being non-orthogonal with respect to another metallization layer.

Figure 18:
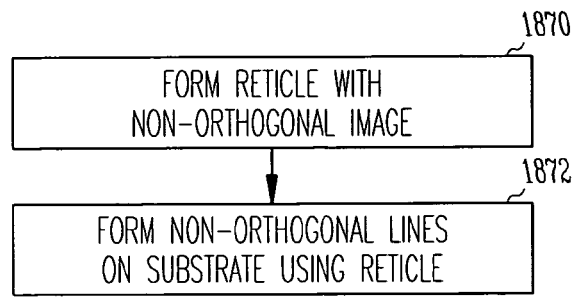
FIG. 18 illustrates a method for forming non-orthogonal lines on a substrate according to various embodiments of the present subject matter.

FIG. 18 illustrates a method for forming non-orthogonal lines on a substrate according to various embodiments of the present subject matter. In the illustrated method, a reticle is formed with a non-orthogonal image at 1870. According to various embodiments, the non-orthogonal image is formed on the reticle by rotating or otherwise adjusting the reticle to a desired rotational position, and forming the non-orthogonal image on the rotated reticle using a raster-based photolithographic system. At 1872, the non-orthogonal lines are formed on the substrate/wafer using the reticle.

Figure 19:
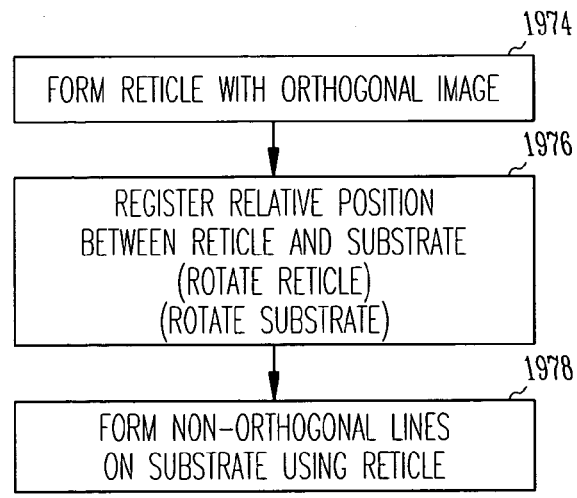
FIG. 19 illustrates a method for forming non-orthogonal lines on a substrate according to various embodiments of the present subject matter.

FIG. 19 illustrates a method for forming non-orthogonal lines on a substrate according to various embodiments of the present subject matter. In the illustrated method, at 1974 a reticle is formed with an orthogonal image using a raster-based system. The relative position between the reticle and the substrate/wafer is registered at 1976. In various embodiments, the reticle is rotated to register the relative position. In various embodiments, the substrate is rotated to register the relative position. At 1978, non-orthogonal lines are formed on the substrate/wafer using the reticle.

Figure 20:
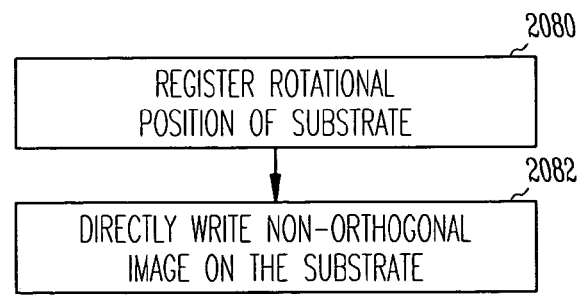
FIG. 20 illustrates a method for forming non-orthogonal lines on a substrate according to various embodiments of the present subject matter.

FIG. 20 illustrates a method for forming non-orthogonal lines on a substrate according to various embodiments of the present subject matter. In the illustrated method, a rotational position of the substrate/wafer is registered at 2080. A non-orthogonal image is directly written on the substrate at 2082.

CONCLUSION

The present subject mater relates to improved photolithographic techniques for forming non-orthogonal (angled) lines. The present subject matter provides a modified raster-based photolithographic process in which a rotational angle ($\theta$) of a reticle is adjusted to change the reference of the orthogonal, raster-based system. Thus, orthogonal lines are capable of being printed using a first data set, and after $\theta$ is adjusted, non-orthogonal lines are capable of being printed using a second data set. The present subject matter allows non-orthogonal lines to be formed at the same minimum thickness as the orthogonal lines, to be formed with even line edges, and to be formed efficiently since each line is capable of being printed in a single scan.

In various embodiments, the present subject matter is used to produce reticles with non-orthogonal lines. In various embodiments, the present subject matter is used to rotate a relative position between a wafer and a reticle to produce non-orthogonal lines on the wafer from the orthogonal lines on the reticle. In various embodiments, the present subject matter is used to directly write non-orthogonal lines on a wafer.

This disclosure refers to several figures that resemble flow diagrams. One of ordinary skill in the art will understand, upon reading and comprehending this disclosure, that the methods related to the flow diagrams may occur in the order as illustrated in the flow diagrams, and may be ordered in another manner. Thus, the present subject matter is not limited to a particular order or logical arrangement.

Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A raster-based photolithographic system for forming orthogonal and non-orthogonal images on a reticle, comprising:
   an imager and a worktable adapted to function to orthogonally image the reticle in an X direction and a Y direction using a raster motion, and to adjust a rotational position of the reticle with respect to the raster motion;
   a database, including a first data set for writing an orthogonal image with respect to the raster motion and a second data set corresponding for writing a non-orthogonal image with respect to the raster motion;
   an X-controller to control imaging of reticles in an X direction;
   a Y-controller to control imaging of reticles in a Y direction; and
   a $\theta$-controller to control an adjustment of the rotational position of the reticle with respect to the raster motion.

2. The system of claim 1, wherein:
   the imager and the worktable are adapted to function to provide the reticle with a first rotational position $\theta_1$ with respect to the raster motion, a second rotational position $\theta_2$ with respect to the raster motion, and a third rotational position $\theta_3$ with respect to the raster motion;
   the first rotational position $\theta_1$ and the second rotational position $\theta_2$ are such that a set of parallel lines in a first image corresponding to $\theta_1$ form an angle of approximately 60° with respect to a set of parallel lines in a second image corresponding to $\theta_2$;
   the second rotational position $\theta_2$ and the third rotational position $\theta_3$ are such that the set of parallel lines in the second image form an angle of approximately 60° with respect to a set of parallel lines in a third image corresponding to $\theta_3$; and
   the first image is on the first reticle, the second image is on the second reticle, and the third image is on the third reticle.

3. The system of claim 1, wherein the worktable is adapted to rotate the reticle.

4. The system of claim 1, further comprising a registration sensor system to accurately register the reticle with respect to the worktable and the imager.

5. The system of claim 1, wherein the imager is an e-beam imager.

6. The system of claim 1, wherein the imager is a laser imager.

7. The system of claim 1, wherein the $\theta$-controller is adapted to step the reticle between a first rotational position $\theta_1$ and a second rotation position $\theta_2$.

8. A raster-based photolithographic system for forming orthogonal and non-orthogonal images on a workpiece, comprising:
   a worktable to receive a workpiece, the worktable having a controlled linear motion along a Y axis, the worktable being adapted to hold the workpiece in at least a first predetermined rotational position ($\theta_1$) and a second predetermined rotational position ($\theta_2$);
   an imager having a controlled linear motion along an X axis;
   a database, including a first data set corresponding to the first rotational position $\theta_1$ for writing an orthogonal first image with respect to a reference and a second data set corresponding to the second rotational position $\theta_2$ for writing a non-orthogonal second image with respect to the reference;

an X-motion controller to control the motion of the imager along the X axis using the first data set when the workpiece is in the first rotational position $\theta_1$ and the second data set when the workpiece is in the second rotational position $\theta_2$; and a Y-motion controller to control the motion of the worktable along the Y axis using the first data set when the workpiece is in the first rotational position $\theta_1$ and the second data set when the workpiece is in the second rotational position $\theta_2$.

9. The system of claim 8, wherein the workpiece is a substrate, the system a device to directly write on the substrate.

10. The method of claim 8, wherein the workpiece is a reticle.

11. The system of claim 8, wherein the worktable is adapted to hold the workpiece in a third predetermined rotational position $\theta_3$.

12. The system of claim 8, wherein:
the database includes a third data set corresponding to the third rotational position $\theta_3$ for writing a non-orthogonal third image with respect to the references;
the first rotational position $\theta_1$ and the second rotational position $\theta_2$ are such that a set of parallel lines in the first image form an angle of approximately 60° with respect to a set of parallel lines in the second image; and
the second rotational position $\theta_2$ and the third rotational position $\theta_3$ are such that the set of parallel lines in the second image form an angle of approximately 60° with respect to a set of parallel lines in the third image.

13. The system of claim 8, further comprising a $\theta$-motion controller to control the position of the workpiece between the first rotational position $\theta_1$ and the second rotational position $\theta_2$.

14. The system of claim 13, wherein the $\theta$-motion controller is adapted to accurately position the workpiece at a plurality of angular positions between the first rotational position $\theta_1$ and the second rotational position $\theta_2$.

15. The system of claim 14, wherein the $\theta$-controller is adapted to step the workpiece between the first rotational position $\theta_1$ and the second rotation position $\theta_2$.

16. The system of claim 8, wherein the imager is an e-beam imager.

17. The system of claim 8, wherein the imager is a laser imager.

* * * * *

UNITED STATES PATENT AND TRADEMARK OFFICE
CERTIFICATE OF CORRECTION

| | | |
|---|---|---|
| PATENT NO. | : 7,105,841 B2 | Page 1 of 1 |
| APPLICATION NO. | : 10/928771 | |
| DATED | : September 12, 2006 | |
| INVENTOR(S) | : Farrar | |

It is certified that error appears in the above-identified patent and that said Letters Patent is hereby corrected as shown below:

In column 6, line 46, delete "or" and insert -- of --, therefor.

In column 16, line 17, in Claim 15, delete "rotation" and insert -- rotational --, therefor.

Signed and Sealed this

Twelfth Day of December, 2006

JON W. DUDAS
*Director of the United States Patent and Trademark Office*